(12) United States Patent
He et al.

(10) Patent No.: US 11,875,500 B2
(45) Date of Patent: Jan. 16, 2024

(54) FAILURE DIAGNOSIS METHOD FOR POWER TRANSFORMER WINDING BASED ON GSMALLAT-NIN-CNN NETWORK

(71) Applicant: WUHAN UNIVERSITY, Hubei (CN)

(72) Inventors: Yigang He, Hubei (CN); Liufei Shen, Hubei (CN); Liulu He, Hubei (CN); Hui Zhang, Hubei (CN); Jiajun Duan, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 532 days.

(21) Appl. No.: 17/161,687

(22) Filed: Jan. 29, 2021

(65) Prior Publication Data

US 2021/0382120 A1 Dec. 9, 2021

(30) Foreign Application Priority Data

Jun. 8, 2020 (CN) .......................... 202010513387.6

(51) Int. Cl.
*G06T 7/00* (2017.01)
*G01R 31/62* (2020.01)
(Continued)

(52) U.S. Cl.
CPC ............ *G06T 7/0004* (2013.01); *G01R 31/62* (2020.01); *G06F 18/213* (2023.01);
(Continued)

(58) Field of Classification Search
CPC .... G06F 18/213; G06F 18/251; G06F 18/217; G06F 18/214; G06F 18/24; G06T 2207/30164; G06T 2207/20064; G06T 2207/20221; G06T 2207/20216; G06T 2207/20081; G06T 2207/20084; G06T 7/0004; G06T 7/0002; G06V 10/82;
(Continued)

(56) References Cited

U.S. PATENT DOCUMENTS 10,839,253 B2 * 11/2020 Balan .................... G06V 10/454
11,619,682 B2 * 4/2023 He ........................... G06N 3/08
702/59

FOREIGN PATENT DOCUMENTS

CN 111595541 A * 8/2020

* cited by examiner

*Primary Examiner* — An H Do
(74) *Attorney, Agent, or Firm* — JCIPRNET (57) ABSTRACT

The invention discloses a failure diagnosis method for a power transformer winding based on a GSMallat-NIN-CNN network. The failure diagnosis method includes: measuring a vibration condition of the transformer winding by using a multi-channel sensor to obtain multi-source vibration data of the transformer; converting the multi-source vibration data obtained through measurement into gray-scale images through GST gray-scale conversion; decomposing, by using a Mallat algorithm, each gray-scale image layer by layer into a high-frequency component sub-image and a low-frequency component sub-image, and fusing the sub-images; reconstructing fused gray-scale images, and coding vibration gray-scale images according to respective failure states of the transformer winding; establishing a failure diagnosis model for the transformer based on the GSMallat-NIN-CNN network; and randomly initializing network parameters to divide a training set and a test set, and training and tuning the network by using the training set; and testing the trained network by using the test set.

10 Claims, 7 Drawing Sheets

(51) Int. Cl.
*G06N 3/04* (2023.01)
*G06N 3/08* (2023.01)
*G06F 18/24* (2023.01)
*G06F 18/213* (2023.01)
*G06F 18/214* (2023.01)
*G06F 18/21* (2023.01)
*G06F 18/25* (2023.01)
*G06V 10/42* (2022.01)
*G06V 10/80* (2022.01)
*G06V 10/82* (2022.01)

(52) U.S. Cl.
CPC .......... *G06F 18/214* (2023.01); *G06F 18/217* (2023.01); *G06F 18/24* (2023.01); *G06F 18/251* (2023.01); *G06N 3/04* (2013.01); *G06N 3/08* (2013.01); *G06T 7/0002* (2013.01); *G06V 10/431* (2022.01); *G06V 10/803* (2022.01); *G06V 10/82* (2022.01); *G06T 2207/20064* (2013.01); *G06T 2207/20081* (2013.01); *G06T 2207/20084* (2013.01); *G06T 2207/20216* (2013.01); *G06T 2207/20221* (2013.01)

(58) Field of Classification Search
CPC ...... G06V 10/431; G06N 3/045; G06N 3/047; G06N 3/08; G06N 3/04
See application file for complete search history.

FAILURE DIAGNOSIS METHOD FOR POWER TRANSFORMER WINDING BASED ON GSMALLAT-NIN-CNN NETWORK

CROSS-REFERENCE TO RELATED APPLICATION

This application claims the priority benefit of China application serial no. 202010513387.6, filed on Jun. 8, 2020. The entirety of the above-mentioned patent application is hereby incorporated by reference herein and made a part of this specification.

BACKGROUND OF THE INVENTION

Field of the Invention

The invention relates to a failure diagnosis method for a power transformer winding, and particularly relates to a failure diagnosis method for a power transformer winding based on a GSMallat-NIN-CNN network.

Description of Related Art

A power transformer is an indispensable part in a power grid. The operation state thereof is closely related to the safety and reliability of the operation of a power system. Therefore, whether a potential issue/failure of the transformer can be quickly detected and timely dealt with has become an issue in relevant industries.

According to the statistics of China, winding failures are the main cause of transformer failures and account for up to 70% of the total number of failures. The conventional transformer failure diagnosis methods are all based on off-line detection means. The test data thereof are not real-time, and the failure position and type cannot be determined effectively. Meanwhile, based on a vibration method, vibration signals are collected real-time from the surface of the oil tank of the transformer, and the operation state of the transformer is determined by analyzing the variations of forces received by the winding. Conventional extraction methods include Fast Fourier transformation (FFT), wavelet transformation (WT), and Hilbert-Huang transformation (HHT), etc. While some progresses have been made, such method is still limited to a certain extent. Two-dimensional image recognition is a failure diagnosis method newly emerged in recent years. Such method makes use of spatial scale invariance and converts one-dimensional vibration signals into two-dimensional gray-scale images to reduce the computational load by carrying out gray-scale conversion through polar coordinates. However, relevant reference documents are yet to explicate the noise processing of the transformer, so the accuracy of the diagnosis on the transformer is low.

In a convolutional neural network (CNN), signals are decomposed in a two-dimensional space through a convolutional process using a convolutional kernel, and abstract feature information is extracted. With such process, features which cannot be expressed in a one-dimensional space can be more comprehensively expressed in a two-dimensional space, thereby providing higher generalization and classification abilities. CNNs have been widely used in various fields such as image classification, target detection, semantic image segmentation, etc.

As the distances to the failure positions and the propagation paths of the failures differ, the degrees to which the vibration signals are attenuated when arriving at the surface of the oil tank also differ. Regarding the single-sidedness of features in data collected by a single sensor, according to the invention, vibration signals are collected through multi-source sensor channels. As for the significant amount of redundant information in the multi-source information, gray-scale image fusion is carried out by resorting to the image complementarity principle, and a failure diagnosis model for a transformer winding based on the GSMallat-NIN-CNN network is proposed. Images are fused by using fast wavelet transformation, and fused images of vibration signal are input to the CNN network. An NIN network is integrated and a 1*1 convolutional kernel is used as a network function approximator. Input fused images are weighted by using multi-channel cascaded linear weighting, and two layers of 3*3 convolution are adopted to replace the original 5*5 convolutional layer to reduce network parameters. Output fused images are added up for an average by using GAP, and the average is adopted as the output value of each class and input to the classifier for identification and classification. Such process replaces the process of converting the dimensionality of feature information at the fully connected layer. By inputting the fused images into the classifier, the whole network performs two-dimensional computation by using the images and does not require matrix conversion. Thus, the computational load is significantly reduced, and the failure diagnosis for the transformer winding is carried out in a more efficient way.

SUMMARY OF THE INVENTION

The invention touches upon the severe loss of features in the conventional data pre-processing method, the inconsistency across the intensities measured in single-source signals due to positions, as well as the large amount of redundant information in multi-source signals, and provides a failure diagnosis method for a power transformer winding based on the GSMallat-NIN-CNN network. With the method, the diagnosis is carried out in a more intelligent, efficient, and accurate way.

The technical solution for solving the technical issue is as follows.

An aspect of the invention provides a failure diagnosis method for a power transformer winding based on a GSMallat-NIN-CNN network. The failure diagnosis method includes: Step 1: measuring a vibration condition of the transformer winding by using a multi-channel sensor to obtain multi-source vibration data of the transformer; Step 2: converting the multi-source vibration data obtained through measurement into gray-scale images through GST gray-scale conversion; Step 3: decomposing, by using a Mallat algorithm, each of the gray-scale images layer by layer into a high-frequency component sub-image and a low-frequency component sub-image, wherein the high-frequency component sub-images are fused through region-based property measurement, and the low-frequency component sub-images are fused through weighted averaging; Step 4: reconstructing fused gray-scale images, and coding vibration gray-scale images according to respective failure states of the transformer winding; Step 5: establishing a failure diagnosis model for the transformer based on the GSMallat-NIN-CNN network; and Step 6: randomly initializing network parameters to divide the fused gray-scale images and the corresponding failure state codes into a training set and a test set based on a predetermined ratio, and training and tuning the network by using the training set; and Step 7: preserving the network which has been trained, testing the network by using the test set, and performing a failure diagnosis on a transformer to be diagnosed according to the GSMallat-NIN-CNN network which has been trained.

Specifically, obtaining the multi-source vibration data of the transformer in Step 1 includes: collecting signals from a surface of an oil tank of the transformer by using a plurality of sensors, wherein the sensors are respectively located in the middle of three-terminal regions on a high voltage side and a low voltage side and on two sides of a tank body. The multi-source vibration data collected respectively include information of four states including: a state of the transformer winding operating normally, a winding inter-turn short circuit, an inter-phase short circuit, and a coil being grounded.

More specifically, converting the multi-source vibration data into the gray-scale images in Step 2 of the invention includes: dividing multi-source vibration signals, as input signals, into n numerical arrays according to a randomization principle, an intercept point is randomly chosen, each numerical array sample is converted into a M*N matrix, the M*N matrix is converted into a size of an image through spatial-domain mapping, a spatial coordinate position of each point in the numerical array corresponds to each pixel point of a pixel, an intercepted numerical array is normalized, and the numerical array is converted into a pixel gray-level value range of 0 to 255 of the gray-scale images, so that numerical values are mapped to corresponding pixel points in an image, and a value of each of the pixel points is clearly expressed with a number from 0 to 255, all feature information of the image is extracted, and finished gray-scale images are output.

More specifically, fusing the gray-scale images in Step 3 of the invention includes: decomposing and reconstructing the images by choosing three wavelet decomposition layers by using a Mallat's fast wavelet transformation algorithm, wherein the images are decomposed into low-frequency components and high-frequency components in three directions comprising a vertical direction, a horizontal direction, and a diagonal direction, the low-frequency components are fused through weighted averaging, so as to uniform a region having a gray-scale value difference is greater than a threshold, reduce an obvious difference in the image, and suppress a feature loss phenomenon in image fusion; and processing the high-frequency components through the region-based property measurement, wherein energies E in a region of the images are compared, a matching degree M is calculated, a matching threshold T is set, and a suitable weight and variable are chosen, as factors for image fusion, through weighting and operator selection, to facilitate edge details.

More specifically, a formula for calculating fusion of the high-frequency component images in Step 3 of the invention includes: when the high-frequency components are processed through the region-based property measurement, a formula for calculating region energies corresponding to two images is as follows:

$$E_l(n,m) = \sum_{n' \in J, m' \in k} w^l(n',m') [Lp_l(n+n', m+m')],$$

wherein E represents a region energy of an $l^{th}$ layer, $LP_l$ represents an image of the $l^{th}$ layer, w represents a weight coefficient, (n, m) represents a center point of a region, and J, K define a size of a range of the region, (n', m') represents a point moving within the range of J, K within the region, wherein, to calculate a matching degree of the corresponding region between the two images, a registration process is performed, a matching threshold is defined, and a mathematical model for the matching degree is represented as follows:

$$M_{l,AB}(n,m) = \frac{2\sum_{n' \in J, m' \in k} w^l(n',m') Lp_{l,A}(n+n', m+m') Lp_{l,B}(n+n', m+m')}{E_{l,A}(n+m) + E_{l,B}(n+m)},$$

given that a matching threshold is defined as T, if $M_{l,AB}(n,m) < T, 0.5 < T < 1$, then an image result is:

$$\begin{cases} Lp_{l,f}(n,m) = Lp_{l,A}(n,m), & E_{l,A}(n,m) \geq E_{l,B}(n,m) \\ Lp_{l,f}(n,m) = Lp_{l,B}(n,m), & E_{l,A}(n,m) < E_{l,B}(n,m) \end{cases},$$

if $M_{l,AB}(n,m) \geq T, 0.5 < T < 1$, then the image result is:

$$\begin{cases} Lp_{l,f}(n,m) = W_{l,max}(n,m) Lp_{l,A}(n,m) + W_{l,min}(n,m) Lp_{l,B}(n,m), \\ \quad E_{l,A}(n,m) \geq E_{l,B}(n,m) \\ Lp_{l,f}(n,m) = W_{l,min}(n,m) Lp_{l,A}(n,m) + W_{l,max}(n,m) Lp_{l,B}(n,m), \\ \quad E_{l,A}(n,m) < E_{l,B}(n,m) \end{cases}$$

wherein $\begin{cases} W_{l,min}(n,m) = \frac{1}{2} - \frac{1}{2}\left[\frac{1-M_{l,AB}(n,m)}{1-T}\right] \\ W_{l,max}(n,m) = 1 - M_{l,min}(n,m) \end{cases} (0 \leq 1 \leq N).$ More specifically, a formula for fusion calculation for the low-frequency component images in Step 3 of the invention includes: fusing the low-frequency components based on weighted averaging, and given that k, α, β is a weighting factor, F is an output result, then a fusion principle is:

$$F(j,k) = (A_{(j,k)} + k \times B_{(j,k)} + \ldots + k^n \times B_{(j,k)}) \times \alpha - (A_{(j,k)} - k \times B_{(j,k)} - \ldots - k^n \times B_{(j,k)}) \times \beta,$$

wherein by fusing the low-frequency components of images A and B, a new image of j layer is formed, wherein details and a denoising property in the image of the layer is balanced.

More specifically, coding the vibration gray-scale images in Step 4 of the invention includes: performing image reconstruction on the fused high-frequency component and low-frequency component images, and coding states of reconstructed images according to the failure states of the winding, wherein the failure states comprise: normal operation, inter-turn short circuit, inter-phase short circuit, and grounded coil.

Specifically, establishing the failure diagnosis model for the transformer based on the GSMallat-NIN-CNN network in Step 5 of the invention includes: integrating an NIN network and using a 1*1 convolutional kernel as a network function approximator, weighting fused images that are input by using multi-channel cascaded linear weighting, and replacing an original 5*5 convolutional layer with two layers of 3*3 convolution to reduce network parameters; and adding up fused images that are output to obtain an average by using GAP, and adopting the average as an output value of each class and input to a classifier for identification and classification, which replaces a process of dimensionality conversion on feature information at a fully connected layer, wherein by inputting the fused images into the classifier, the whole network performs two-dimensional computation by using the images and does not require matrix conversion, and wherein the whole network comprises four convolutional layers, two average-pooling layer, three ReLU layer, one Mlpc layer, and a global average-pooling layer.

More specifically, training the model of the network in Step 6 of the invention includes: dividing fused vibration images of respective failure states and corresponding codes of the failure states into a training set and a test set based on a ratio of 4:1, wherein a dimensionality of data for forward propagation to the Mlpc layer is set as n, n partial feature maps are output, n pooling kernels, whose sizes and step lengths are same as the feature maps, are adopted, averages of the pooling kernels are obtained to be input to the classifier, and an expression formula is:

$$S_{ap}^l = \frac{1}{c}\sum_{k=1}^{c} X_{1:h,1:w,i}^l,$$

wherein a term on the left represents a global average pooling result of an $l^{th}$ layer, a term X represents a range of a feature output map corresponding to the pooling kernel, and h and w represent values of the range, an error between an actually output vector Y and a predicted vector H is obtained, l is set as a total number of classifications, a square error is adopted as an error function to determine an error of a network calculation result, a mathematical expression is as follows:

$$E = \frac{1}{2}\sum_{n=1}^{l}(H_n - Y_n)^2 = \frac{1}{2}\|H_n - Y_n\|^2,$$

wherein n represents an $n^{th}$ dimension of data, $H_n$ represents the $n^{th}$ dimension of predicted data, $Y_n$ represents the $n^{th}$ dimension of actual data obtained through mapping after x data is input, and a gradient is obtained for a convolutional layer, the gradient being substantially a partial derivative of a mean difference function to a parameter weight and a bias number, as represented in the following:

$$\frac{\partial E}{\partial K_{ij}} = \sum_{U,v}(\delta_j^n)uv(S_i^{n-1})uv,$$

wherein S represents an area of a feature map and a convolution operator calculation, n represents an $n^{th}$ pooling layer, i represents an $i^{th}$ feature map of the $n^{th}$ pooling layer, and, based on a weight shared principle of a CNN network, associated gradients are added up for a sum and a gradient formula is obtained:

$$\frac{\partial E}{\partial b_j} = \sum_{U,v}(\delta_j^k)uv.$$

The calculation is continuously optimized based on a stochastic gradient descend method to obtain a gradient of each layer, an adaptive parameter (W, b) in the network is updated to optimize performance of the model, and an updated mathematical model is as follows:

$$\begin{cases} k_{ij}^l = k_{ij}^l - \beta\dfrac{\partial E}{\partial k_{ij}^l} \\ b_j^l = b_j^l - \beta\dfrac{\partial E}{\partial b_j^l} \end{cases}.$$

More specifically, testing the network by using the test set in Step 7 of the invention includes: simulating a normal operation state and three short circuit situations of the transformer by using a comsol finite element simulation software, inputting data of measured vibration signals of the test set, and, following a processing flow, inputting the data to the network that has been trained and preserved for the failure diagnosis.

The failure diagnosis method for a power transformer winding based on a GSMallat-NIN-CNN network according to the embodiments of the invention is capable of effectively suppressing the variation of the intensity of the single-source signal property information in the transformer vibration signal through distance, and reducing the significant amount of redundant information in the multi-source image which results in a low signal-to-noise ratio. Experimental results suggest that such method effectively suppresses the noise in the multi-source signal, increases the completeness of feature information, reduces the computational load, and increases the failure diagnosis accuracy.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

To more clearly and comprehensively describe the objectives, technical solutions, and advantages of the invention, the invention will be described in detail in the following with reference to the accompanying drawings and embodiments. It should be understood that the embodiments specifically described herein merely serve to describe the invention and shall not be construed as limitations on the invention.

Figure 1:
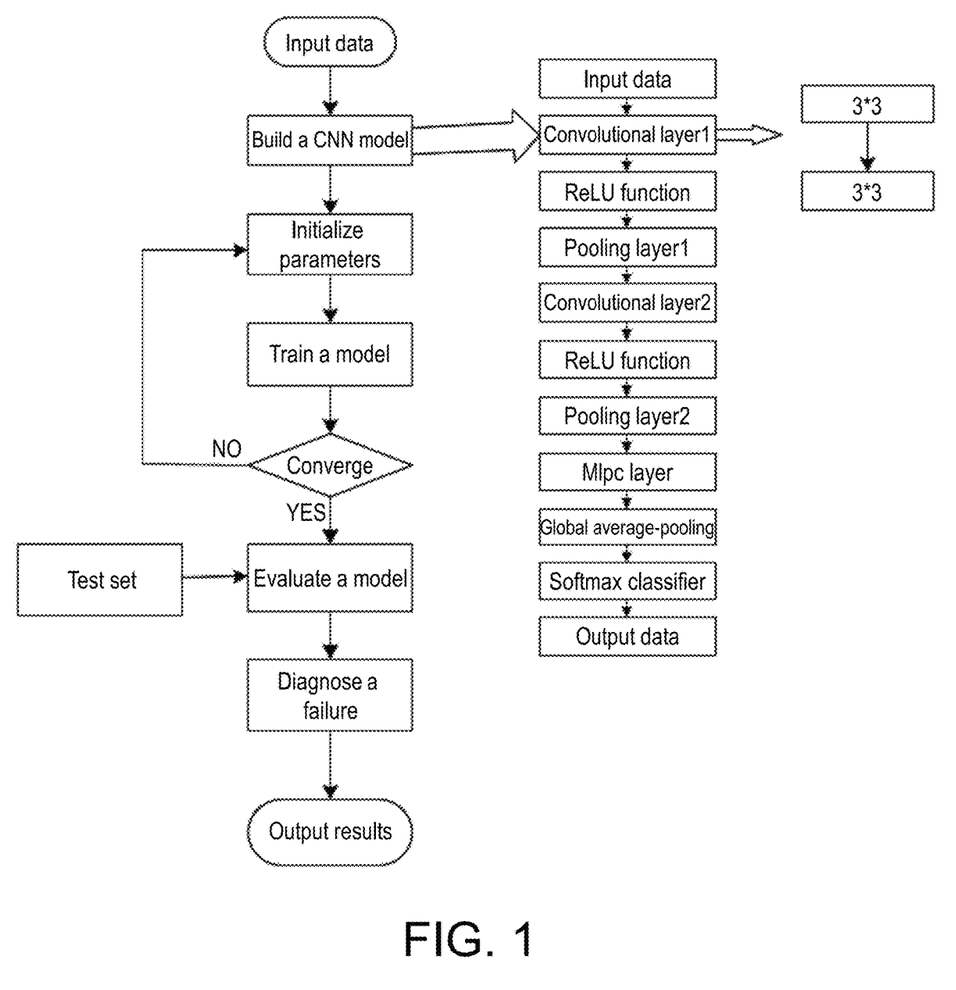
FIG. 1 illustrates a structure of a model of a network according to the invention.

As shown in FIG. 1, in the invention, a complicated relationship in which the intensities of vibration signals at multiple positions of the transformer vary with the distances to a failure vary is comprehensively considered, and a GSMallat network which realizes a failure diagnosis for a transformer winding based on multi-source vibration signals is constructed. The flowchart thereof is as shown in FIG. 1.

A failure diagnosis method for a power transformer winding based on a GSMallat-NIN-CNN network according to an embodiment of the invention includes steps explicated in the following.

Step 1: A vibration condition of the transformer winding is measured by using a multi-channel sensor to obtain multi-source vibration data of the transformer.

Figure 3A:
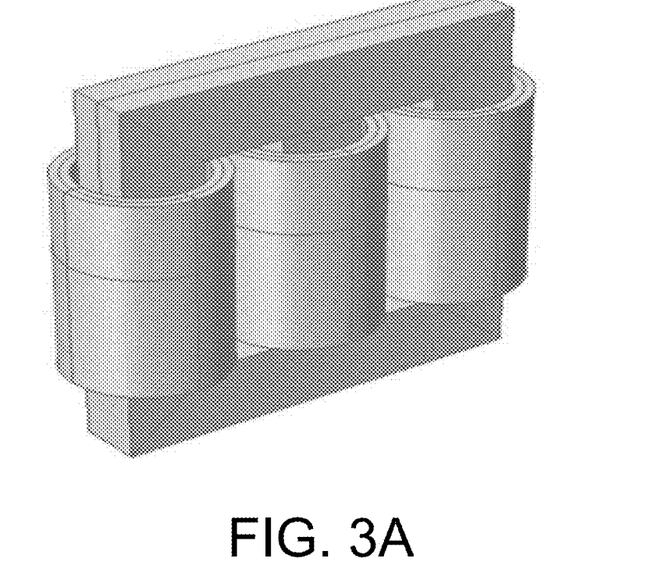
FIG. 3A is an internal structure a of a simulated model of a transformer according to an embodiment of the invention.
Figure 3B:
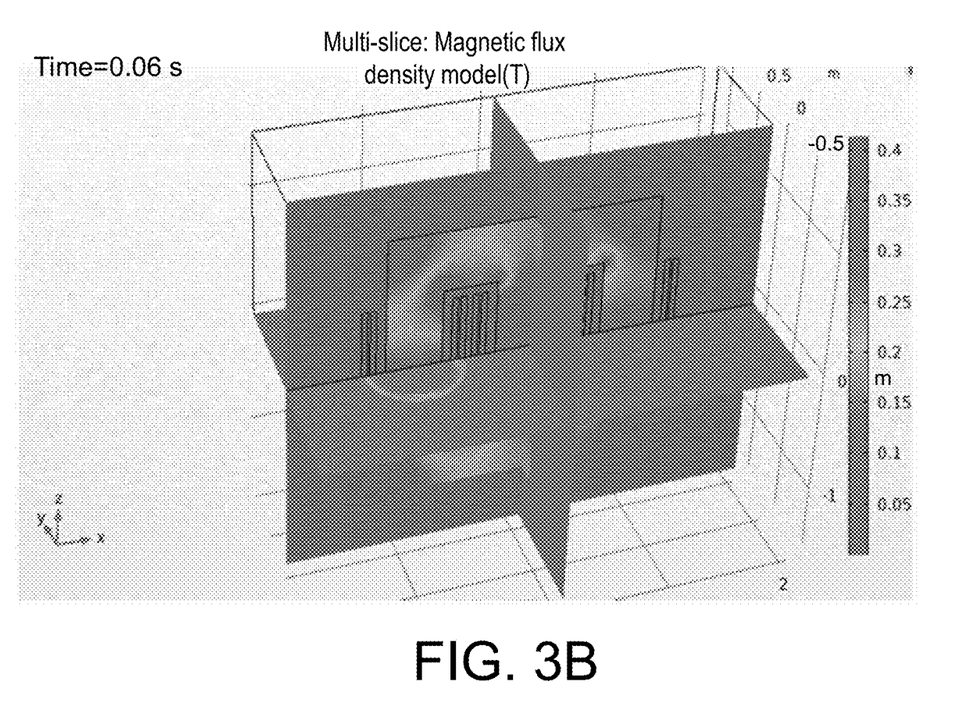
FIG. 3B is an internal structure b of a simulated model of a transformer according to an embodiment of the invention.

Firstly, vibration information is measured according to Step 1. Referring to a simulated model built for the transformer as shown in FIGS. 3A and 3B, the transformer is a three-phase, three-limb type transformer. The internal results thereof are as shown the figure, and the parameters thereof are as set in Table 1.

TABLE 1

Main Parameters of Transformer

| Linking | Turns of primary winding | Turns of secondary winding | Resistance/Ω of primary winding | Resistance/Ω of secondary winding | Input voltage/kV |
|---|---|---|---|---|---|
| Yyn0 | 917 | 10 | 6.19 | $6.42 \times 10^{-6}$ | 35 |

Figure 4:
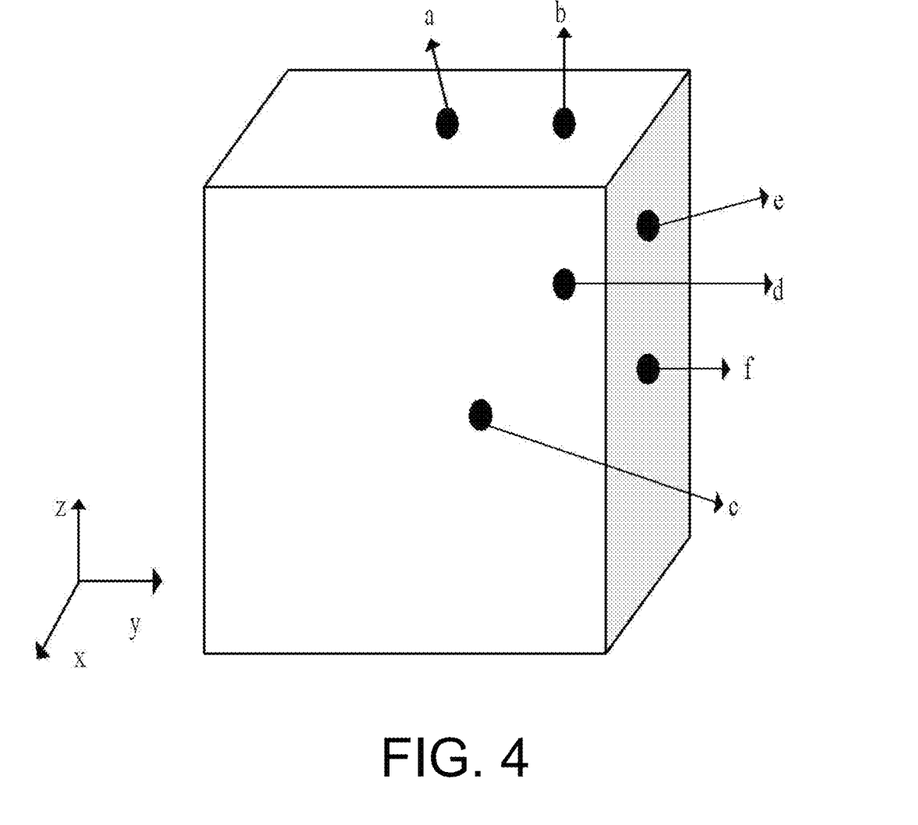
FIG. 4 is a diagram illustrating measurement points of a transformer winding according to an embodiment of the invention.

10% of the turns in a low voltage winding of a B-phase winding in the simulated model are removed, and a phase resistor is grounded to simulate a short circuit failure of 10% of the turns. The loads of the low-voltage windings of the B and C phases are removed, and the resistors of the two phases are grounded to simulate an inter-phase short circuit. The load resistor of the B phase is abandoned, and the phase resistor is directly grounded to simulated a single-phase short circuit failure. In addition, the winding is measured at different positions according to the measurement points shown in FIG. 4 to collect vibration signals via multiple channels.

The paths of propagation may include liquid propagation and solid propagation. Due to the influences of different propagation media and propagation distances, the vibration intensities measured by sensors at different positions differ. If the vibration intensities are directly input to a deep neural network for computation, a significant error may occur in the failure diagnosis. Therefore, multiple sensors are used to collect signals from the surface of the oil tank, and such information of multiple sources are input into and train the network to alleviate the diagnosis error. The sensors are respectively located in the middle of three-terminal regions on the high voltage side and the low voltage side and two sides of the tank body. The multi-channel information that is collected respectively include information of four states, i.e., a state of the transformer winding operating normally, a winding inter-turn short circuit, an inter-phase short circuit, and a coil being grounded.

Step 2: The multi-source vibration data obtained through measurement are converted into gray-scale images through GST gray-scale conversion.

The vibration signals, as input signals, are divided into n shares according to the randomization principle, the intercept point is randomly chosen, and each sample in a sample set is converted into an M*N matrix (through spatial-domain mapping, the matrix of M*N is converted into the size of an image), the spatial coordinate position of the point of the array corresponds to each pixel point of the pixel, the numerical array after being intercepted is normalized, and the numerical array is converted into a pixel gray-level value range of 0 to 255 of the gray-scale images, so that the numerical values can be mapped to corresponding pixel points in the image, and the value of each of the pixel points can be clearly expressed with a number of 0 to 255. All the feature information of the image is extracted, and finished gray-scale images are output.

The measured multi-source vibration information is subjected to gray-scale conversion to be converted into two-dimensional gray-scale images, and the gray-scale images are registered, so that the pixel sizes of the images are the same.

Step 3: By using a Mallat algorithm, each of the gray-scale images layer by layer is decomposed into a high-frequency component sub-image and a low-frequency component sub-image. The high-frequency component sub-images are fused through region-based property measurement, and the low-frequency component sub-images are fused through weighted averaging.

By using the Mallat algorithm, the gray-scale images in the respective states are decomposed through three wavelet decomposition layers by using the complementarity principle of the images.

When the high-frequency components are processed based on the region-based property measurement, the formula for calculating the region energies corresponding to two images is as follows:

$$E_l(m, n) = \sum_{n' \in J, m' \in k} w^j(n', m')[Lp_l(n + n', m + m')]$$

wherein E represents the region energy of a layer 1, LP represents an image, and w represents a weight coefficient; to calculate a matching degree of a corresponding region between the two images, a registration process is performed, a matching threshold is defined, and a matching degree mathematical model is represented as follows:

$$M_{l,AB}(n, m) = \frac{2 \sum_{n' \in J, m' \in k} w^j(n', m') Lp_{l,A}(n + n', m + m') Lp_{l,B}(n + n', m + m')}{E_{l,A}(n + m) + E_{l,B}(n, m)}$$

given that the matching threshold is defined as T, if $M_{l,AB}$ (n, m)<T, 0.5<T<1, then:

$$\begin{cases} Lp_{l,f}(n, m) = Lp_{l,A}(n, m), E_{l,A}(n, m) \geq E_{l,B}(n, m) \\ Lp_{l,f}(n, m) = Lp_{l,B}(n, m), E_{l,A}(n, m) < E_{l,B}(n, m) \end{cases}$$

if $M_{l,AB}$ (n, m)>=T, 0.5<T<1, then:

$$\begin{cases} Lp_{l,f}(n, m) = W_{l,max}(n, m) Lp_{l,A}(n, m) + W_{l,min}(n, m) Lp_{l,B}(n, m), \\ \quad E_{l,A}(n, m) \geq E_{l,B}(n, m) \\ Lp_{l,f}(n, m) = W_{l,min}(n, m) Lp_{l,A}(n, m) + W_{l,max}(n, m) Lp_{l,B}(n, m), \\ \quad E_{l,A}(n, m) < E_{l,B}(n, m) \end{cases}$$

-continued $$\text{wherein} \begin{cases} W_{l,min}(n,m) = \frac{1}{2} - \frac{1}{2}\left[\frac{1-M_{l,AB}(n,m)}{1-T}\right] \\ W_{l,max}(n,m) = 1 - M_{l,min}(n,m) \end{cases} (0 \le l \le N).$$

The specific formula for calculating the fusion of the low-frequency component sub-images is as follows:

The low-frequency components are fused based on weighted averaging. It is set that k, α, β is a weighting factor, F is an output result, and the fusion principle is:

$$F(j,k)=(A_{(j,k)}+k \times B_{(j,k)}+ \ldots +k^n \times B_{(j,k)}) \times \alpha - (A_{(j,k)} - k \times B_{(j,k)} - \ldots - k^n \times B_{(j,k)}) \times \beta$$

Figure 5:
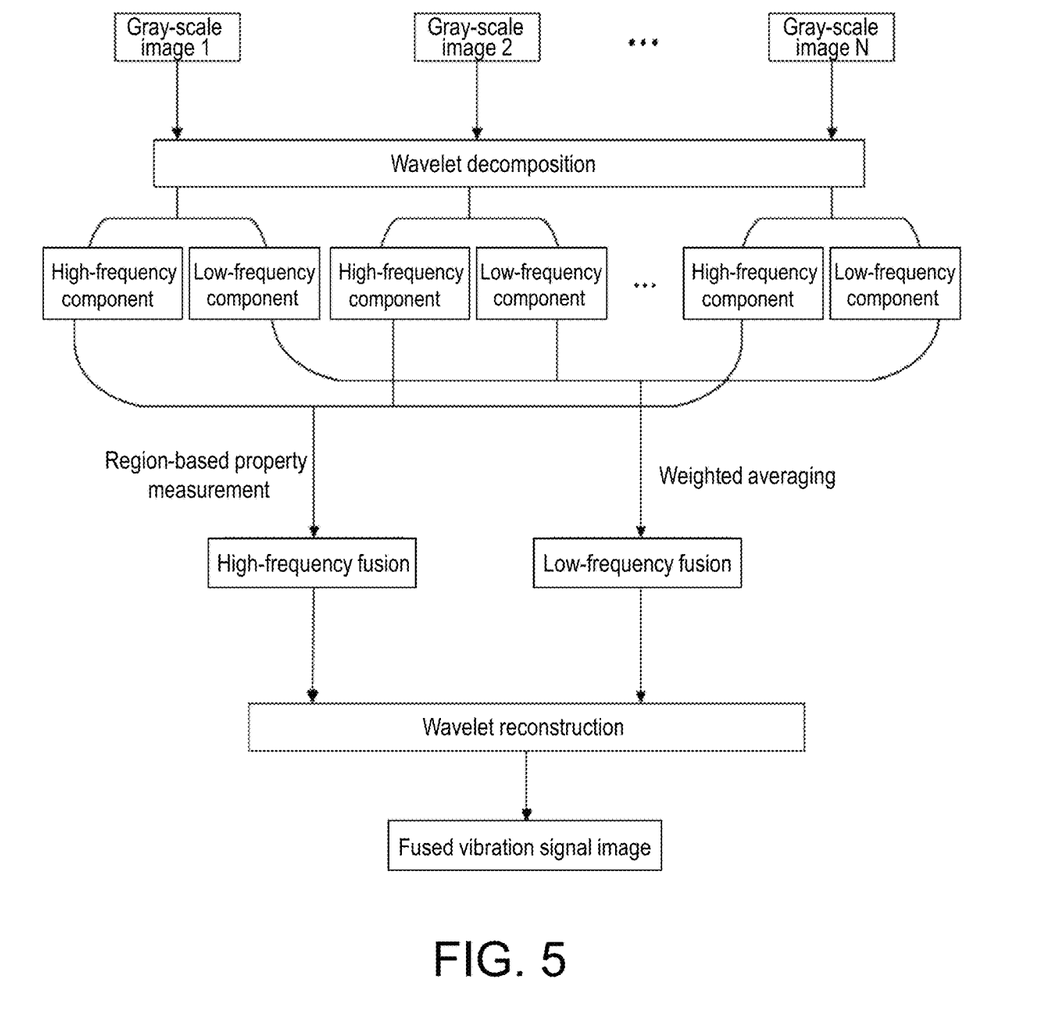
FIG. 5 is a flowchart illustrating fusion based on a GSMallat algorithm according to an embodiment of the invention.

Denoising is achieved while details on the edge become clear to maximally keep valid features. The fusion process is as shown in FIG. 5.

Step 4: Fused gray-scale images are reconstructed, and vibration gray-scale images are coded according to respective failure states of the transformer winding.

Figure 6A:
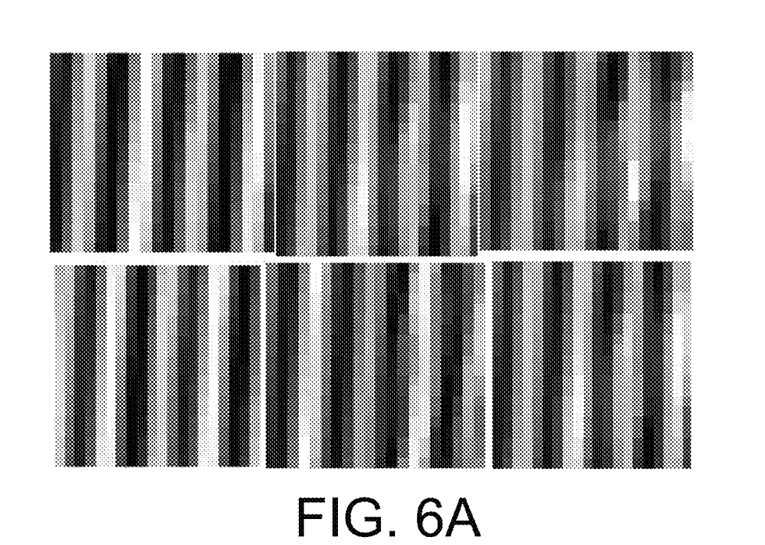
FIG. 6A illustrates an effect picture a of fusion of multi-source information images when a transformer winding is in a normal state according to an embodiment of the invention.
Figure 6B:
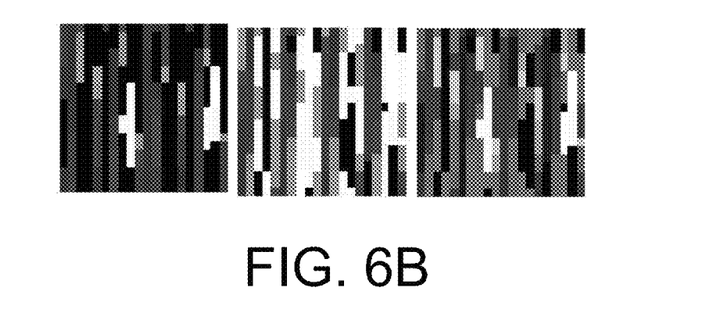
FIG. 6B illustrates an effect picture b of fusion of multi-source information images when a transformer winding is in a normal state according to an embodiment of the invention.
Figure 6C:
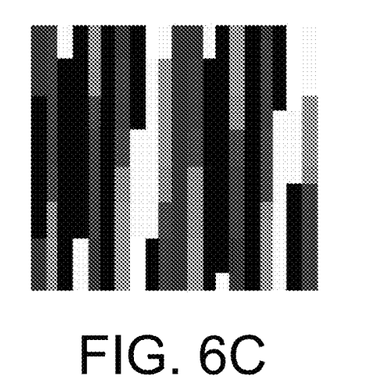
FIG. 6C illustrates an effect picture c of fusion of multi-source information images when a transformer winding is in a normal state according to an embodiment of the invention.
Figure 7:
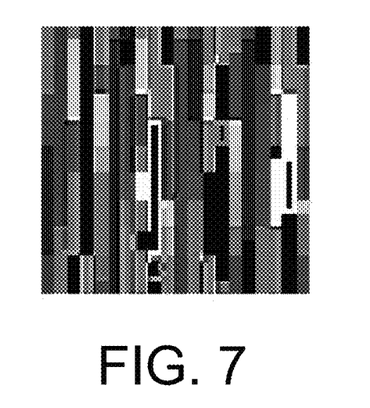
FIG. 7 is a diagram illustrating an effect picture of vibration signals when a winding is in a normal state according to an embodiment of the invention.

The high-frequency component sub-image and the low-frequency sub-image after fusion are reconstructed by using the Mallat algorithm. FIG. 6A are fused images based on a spatial domain fusion principle, and the fused images respective correspond to obtaining the maximum gray scale value, the minimum gray scale value, and the weight averaging method. FIG. 6B illustrates the effect of weight-averaged fusion in multi-scale wavelet decomposition. FIG. 7 illustrates a vibration signal gray-scale image after fusion according to the invention, the details of the edge become clear, the signal-to-noise ratio is increased, and the resolution is increased.

Figure 2:
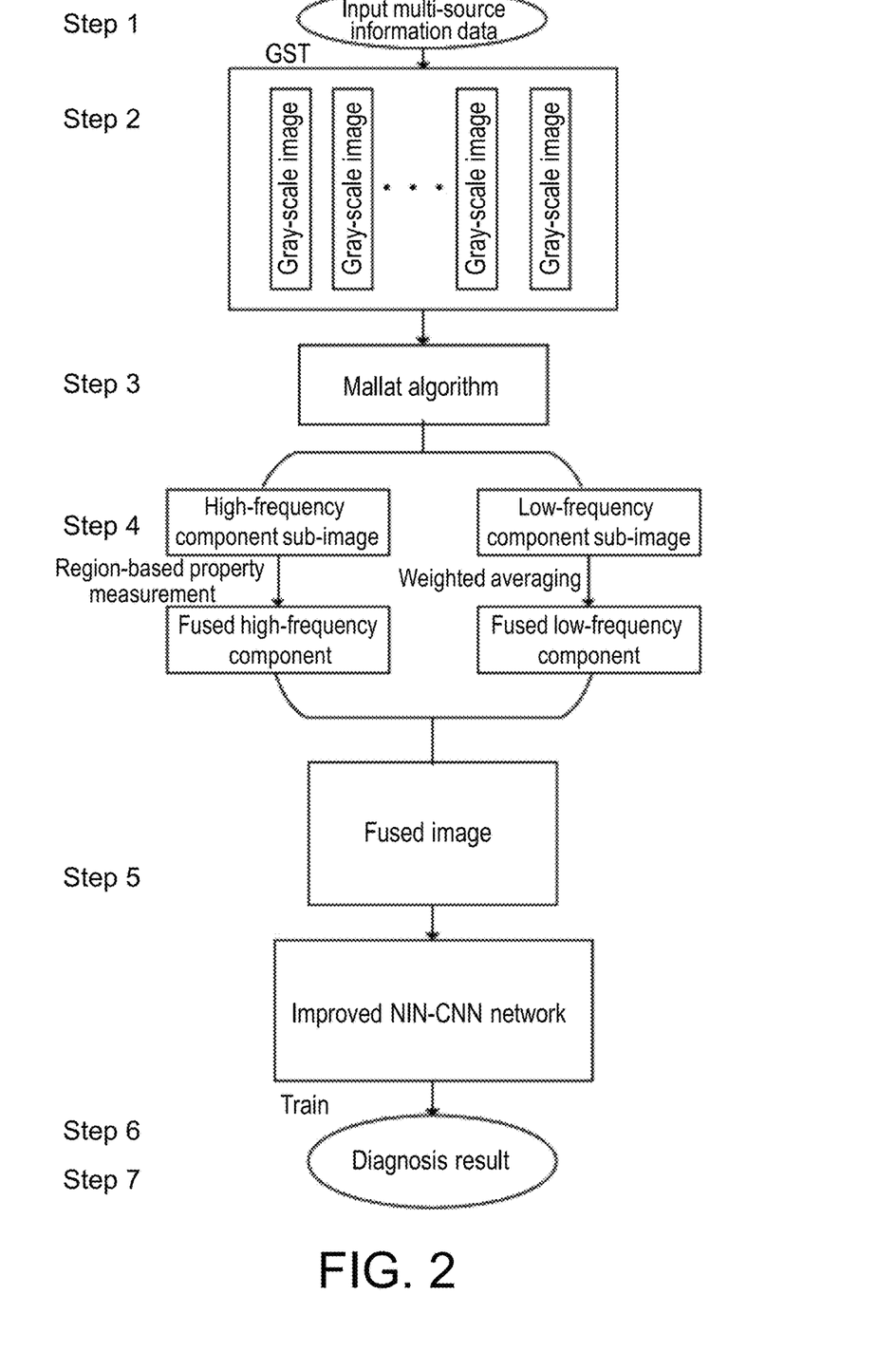
FIG. 2 is a flowchart illustrating a failure diagnosis model for a power transformer winding based on a GSMallat-NIN-CNN network according to an embodiment of the invention.

The reconstructed gray-scale images of the respective states are coded, and the short circuit failures of the transformer are classified into four types, i.e., normal operation, inter-turn short circuit, inter-phase short circuit, and grounded coil, as shown in FIG. 2:

TABLE 2

Codes of States

| Codes of States of Transformer | Code |
| --- | --- |
| Normal | (0, 0, 0, 1) |
| Inter-turn short circuit | (0, 0, 1, 0) |
| Inter-phase short circuit | (0, 1, 0, 0) |
| Grounded coil | (1, 0, 0, 0) |

Step 5: A failure diagnosis model for the transformer is established based on the GSMallat-NIN-CNN network.

The failure diagnosis model for the transformer is constructed based on a GSMallat-NIN-CNN network. A 3*3 convolutional kernel is used to replace the 5*5 convolution, and an NIN network is integrated to add a 1*1 convolutional layer on the basis of the convolutional layer, so that local reception also serves as the input of a micro neural network. The 1*1 convolution serves as a network function approximator to carry out a multi-channel cascaded linear weighting on input feature maps and perform unified calculation on linearly inseparable feature information in the actual operating condition, facilitate potential connections between the respective channels, realize cross-channel linear combinations, and facilitate the accuracy of failure diagnosis. By using GAP, the feature maps output by the last MlpConv layer are added up to obtain an average, and the average is adopted to replace the feature type in the channel. Each feature map corresponds to an average, and serves as an input/output classifier of each class for identification and classification. Thus, it does not require the fully-connected layer to perform dimensionality conversion on the feature information, so the calculation process is omitted, and the amount of parameters are reduced. A trained network performs a failure diagnosis by using the test set. The structure thereof is as shown in Table 3 below.

TABLE 3

Failure Diagnosis Results Based on Multi-source Fusion Model and at Respective Measurement Points

| Measurement point position | Pre-training set | Tuning set | Test set | Diagnosis accuracy (%) |
| --- | --- | --- | --- | --- |
| a | 400 | 100 | 30 | 89.17 |
| b | 400 | 100 | 30 | 88.98 |
| c | 400 | 100 | 30 | 81.56 |
| d | 400 | 100 | 30 | 67.32 |
| e | 400 | 100 | 30 | 79.41 |
| f | 400 | 100 | 30 | 83.77 |
| Multi-source GST | 400 | 100 | 30 | 91.46 |
| GSMallat | 400 | 100 | 30 | 96.94 |

As shown in Table 3, the failure diagnosis model for the power transformer winding based on the GSMallat-NIN-CNN network clearly exhibits a more outstanding performance than the single-source model. The model is compared with NIN-CNN network models based on denoising normalization and wavelet conversion, respectively, and the feature extraction time and the failure diagnosis accuracy are as shown in Table 4 and Table 5 below.

TABLE 4

Feature Extraction Times Based on Different Data Pre-processing Methods

| Pre-processing methods | Pre-training set | Tuning set | Test set | Feature extraction time/s |
| --- | --- | --- | --- | --- |
| Denoising normalization | 400 | 100 | 30 | 3.87 |
| Wavelet conversion | 400 | 100 | 30 | 11.2 |
| Gray-scale conversion | 400 | 100 | 30 | 3.49 |

TABLE 5

Diagnosis Performances Based on Different Data Pre-processing Methods

| Network | Serial no. | Pre-training set | Tuning set | Diagnosis accuracy (%) |
| --- | --- | --- | --- | --- |
| Denoising normalization | 1 | 50 | 100 | 51.69 |
| | 2 | 100 | 100 | 57.92 |
| | 3 | 200 | 100 | 72.43 |
| | 4 | 400 | 100 | 79.33 |
| Wavelet conversion | 5 | 50 | 100 | 77.78 |
| | 6 | 100 | 100 | 82.67 |
| | 7 | 200 | 100 | 90.21 |
| | 8 | 400 | 100 | 93.46 |

Step 6: The network parameters are randomly initialized to divide the fused gray-scale images and the corresponding failure state codes into a training set and a test set based on a predetermined ratio, and the network is trained and tuned by using the training set.

The respective coded failure state vibration images are divided into a training sample set and a test sample set based on a ratio of 4:1. A mapping relationship is obtained through forward propagation, results are output, and the gradient of the parameter of each layer is obtained by calculating a deviation through backward propagation. Weight values of the network are updated to optimize the performance of the network.

400 sets are selected for the training sample set, and 100 sets are selected for each state sample set. Each sample set includes 6 measurement point positions. The sample length of each measurement point position is 784, equivalent to a size of 28*28 after being converted into a gray-scale image. 100 sets are selected as a tuning sample set for tuning, and 30 sets are selected as the test set to test the trained network.

Step 7: The network which has been trained is preserved and tested by using the test set, and a failure diagnosis is performed on a transformer to be diagnosed according to the GSMallat-NIN-CNN network which has been trained.

The normal operation state and three short circuit situations of the transformer are simulated by using a comsol finite element simulation software. Data of vibration signals of the test set are measured and, following the flow chart, the data is input to the network that has been trained and preserved for the failure diagnosis.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A failure diagnosis method for a power transformer winding based on a GSMallat-NIN-CNN network, comprising:
   Step 1: measuring a vibration condition of the transformer winding by using a multi-channel sensor to obtain multi-source vibration data of the transformer;
   Step 2: converting the multi-source vibration data obtained through measurement into gray-scale images through GST gray-scale conversion;
   Step 3: decomposing, by using a Mallat algorithm, each of the gray-scale images layer by layer into a high-frequency component sub-image and a low-frequency component sub-image, wherein the high-frequency component sub-images are fused through region-based property measurement, and the low-frequency component sub-images are fused through weighted averaging;
   Step 4: reconstructing fused gray-scale images, and coding vibration gray-scale images according to respective failure states of the transformer winding;
   Step 5: establishing a failure diagnosis model for the transformer based on the GSMallat-NIN-CNN network;
   Step 6: randomly initializing network parameters to divide the fused gray-scale images and the corresponding failure state codes into a training set and a test set based on a predetermined ratio, and training and tuning the network by using the training set; and
   Step 7: preserving the network which has been trained, testing the network by using the test set, and performing a failure diagnosis on a transformer to be diagnosed according to the GSMallat-NIN-CNN network which has been trained.

2. The failure diagnosis method as claimed in claim 1, wherein obtaining the multi-source vibration data of the transformer in Step 1 comprises:
   collecting signals from a surface of an oil tank of the transformer by using a plurality of sensors, wherein the sensors are respectively located in the middle of three-terminal regions on a high voltage side and a low voltage side and on two sides of a tank body, wherein the multi-source vibration data collected respectively comprise information of four states comprising: a state of the transformer winding operating normally, a winding inter-turn short circuit, an inter-phase short circuit, and a coil being grounded.

3. The failure diagnosis method as claimed in claim 1, wherein converting the multi-source vibration data into the gray-scale images in Step 2 comprises:
   dividing multi-source vibration signals, as input signals, into n numerical arrays according to a randomization principle, an intercept point is randomly chosen, each numerical array sample is converted into a M*N matrix, the M*N matrix is converted into a size of an image through spatial-domain mapping, a spatial coordinate position of each point in the numerical array corresponds to each pixel point of a pixel, an intercepted numerical array is normalized, and the numerical array is converted into a pixel gray-level value range of 0 to 255 of the gray-scale images, so that numerical values are mapped to corresponding pixel points in an image, and a value of each of the pixel points is clearly expressed with a number from 0 to 255, all feature information of the image is extracted, and finished gray-scale images are output.

4. The failure diagnosis method as claimed in claim 1, wherein fusing the gray-scale images in Step 3 comprises:
   decomposing and reconstructing the images by choosing three wavelet decomposition layers by using a Mallat's fast wavelet transformation algorithm, wherein the images are decomposed into low-frequency components and high-frequency components in three directions comprising a vertical direction, a horizontal direction, and a diagonal direction, the low-frequency components are fused through weighted averaging, so as to uniform a region having a gray-scale value difference is greater than a threshold, reduce an obvious difference in the image, and suppress a feature loss phenomenon in image fusion; and processing the high-frequency components through the region-based property measurement, wherein energies E in a region of the images are compared, a matching degree M is calculated, a matching threshold T is set, and a suitable weight and variable are chosen, as factors for image fusion, through weighting and operator selection, to facilitate edge details.

5. The failure diagnosis method as claimed in claim 4, wherein a formula for calculating fusion of the high-frequency component images in Step 3 comprises:
   when the high-frequency components are processed through the region-based property measurement, a formula for calculating region energies corresponding to two images is as follows:

$$E_l(n,m) = \Sigma_{n' \in J, m' \in K} w^j(n',m')[Lp_l(n+n', m+m')],$$

wherein E represents a region energy of an $l^{th}$ layer, $LP_l$ represents an image of the $l^{th}$ layer, w represents a weight coefficient, (n, m) represents a center point of a region, and J, K define a size of a range of the region, (n', m') represents a point moving within the range of J, K within the region, wherein, to calculate a matching degree of the corresponding region between the two images, a registration process is performed, a matching threshold is defined, and a mathematical model for the matching degree is represented as follows:

$$M_{l,AB}(n, m) = \frac{2\sum_{n' \in J, m' \in k} w^l(n', m') Lp_{l,A}(n+n', m+m') Lp_{l,B}(n+n', m+m')}{E_{l,A}(n+m) + E_{l,B}(n, m)},$$

given that a matching threshold is defined as T, if $M_{l,AB}(n,m) < T, 0.5 < T < 1$, then an image result is:

$$\begin{cases} Lp_{l,f}(n, m) = Lp_{l,A}(n, m), E_{l,A}(n, m) \geq E_{l,B}(n, m) \\ Lp_{l,f}(n, m) = Lp_{l,B}(n, m), E_{l,A}(n, m) < E_{l,B}(n, m) \end{cases},$$

if $M_{l,AB}(n, m) \geq T, 0.5 < T < 1$, then the image result is:

$$\begin{cases} Lp_{l,f}(n, m) = W_{l,max}(n, m) Lp_{l,A}(n, m) + W_{l,min}(n, m) Lp_{l,B}(n, m), \\ \quad E_{l,A}(n, m) \geq E_{l,B}(n, m) \\ Lp_{l,f}(n, m) = W_{l,min}(n, m) Lp_{l,A}(n, m) + W_{l,max}(n, m) Lp_{l,B}(n, m), \\ \quad E_{l,A}(n, m) < E_{l,B}(n, m) \end{cases},$$

wherein $\begin{cases} W_{l,min}(n, m) = \frac{1}{2} - \frac{1}{2}\left[\frac{1 - M_{l,AB}(n, m)}{1 - T}\right] \\ W_{l,max}(n, m) = 1 - M_{l,min}(n, m) \end{cases} (0 \leq l \leq N).$

6. The failure diagnosis method as claimed in claim 4, wherein a formula for fusion calculation for the low-frequency component images in Step 3 comprises:

fusing the low-frequency components based on weighted averaging, and given that k, α, β is a weighting factor, F is an output result, then a fusion principle is:

$$F(j,k) = (A_{(j,k)} + k \times B_{(j,k)} + \ldots + k^n \times B_{(j,k)}) \times \alpha -, (A_{(j,k)} - k \times B_{(j,k)} - \ldots - k^n \times B_{(j,k)}) \times \beta$$

wherein by fusing the low-frequency components of images A and B, a new image of j layer is formed, wherein details and a denoising property in the image of the layer is balanced.

7. The failure diagnosis method as claimed in claim 1, wherein coding the vibration gray-scale images in Step 4 comprises:

performing image reconstruction on the fused high-frequency component and low-frequency component images, and coding states of reconstructed images according to the failure states of the winding, wherein the failure states comprise: normal operation, inter-turn short circuit, inter-phase short circuit, and grounded coil.

8. The failure diagnosis method as claimed in claim 1, wherein establishing the failure diagnosis model for the transformer based on the GSMallat-NIN-CNN network in Step 5 comprises:

integrating an NIN network and using a 1*1 convolutional kernel as a network function approximator, weighting fused images that are input by using multi-channel cascaded linear weighting, and replacing an original 5*5 convolutional layer with two layers of 3*3 convolution to reduce network parameters; and adding up fused images that are output to obtain an average by using GAP, and adopting the average as an output value of each class and input to a classifier for identification and classification, which replaces a process of dimensionality conversion on feature information at a fully connected layer, wherein by inputting the fused images into the classifier, the whole network performs two-dimensional computation by using the images and does not require matrix conversion, and wherein the whole network comprises four convolutional layers, two average-pooling layer, three ReLU layer, one Mlpc layer, and a global average-pooling layer.

9. The failure diagnosis method as claimed in claim 8, wherein training the model of the network in Step 6 comprises:

dividing fused vibration images of respective failure states and corresponding codes of the failure states into a training set and a test set based on a ratio of 4:1, wherein a dimensionality of data for forward propagation to the Mlpc layer is set as n, n partial feature maps are output, n pooling kernels, whose sizes and step lengths are same as the feature maps, are adopted, averages of the pooling kernels are obtained to be input to the classifier, and an expression formula is:

$$S_{ap}^l = \frac{1}{c}\sum_{i=1}^{c} X_{1:h,1:w,i}^l,$$

wherein a term on the left represents a global average pooling result of an $l^{th}$ layer, a term X represents a range of a feature output map corresponding to the pooling kernel, and h and w represent values of the range, an error between an actually output vector Y and a predicted vector H is obtained, l is set as a total number of classifications, a square error is adopted as an error function to determine an error of a network calculation result, a mathematical expression is as follows:

$$E = \frac{1}{2}\sum_{n=1}^{l}(H_n - Y_n)^2 = \frac{1}{2}\|H_n - Y_n\|^2,$$

wherein n represents an $n^{th}$ dimension of data, $H_n$ represents the $n^{th}$ dimension of predicted data, $Y_n$ represents the $n^{th}$ dimension of actual data obtained through mapping after x data is input, and a gradient is obtained for a convolutional layer, the gradient being substantially a partial derivative of a mean difference function to a parameter weight and a bias number, as represented in the following:

$$\frac{\partial E}{\partial K_{ij}} = \sum_{U,v}(\delta_j^n)uv(S_i^{n-1})uv,$$

wherein S represents an area of a feature map and a convolution operator calculation, n represents an $n^{th}$ pooling layer, i represents an $i^{th}$ feature map of the $n^{th}$ pooling layer, and, based on a weight shared principle of a CNN network, associated gradients are added up for a sum and a gradient formula is obtained:

$$\frac{\partial E}{\partial b_j} = \sum_{U,v}(\delta_j^k)uv,$$

wherein the calculation is continuously optimized based on a stochastic gradient descend method to obtain a gradient of each layer, an adaptive parameter (W, b) in the network is updated to optimize performance of the model, and an updated mathematical model is as follows:

$$\begin{cases} k_{ij}^l = k_{ij}^l - \beta \dfrac{\partial E}{\partial k_{ij}^l} \\ b_j^l = b_j^l - \beta \dfrac{\partial E}{\partial b_j^l} \end{cases}.$$

10. The failure diagnosis method as claimed in claim 1, wherein testing the network by using the test set in Step 7 comprises:
   simulating a normal operation state and three short circuit situations of the transformer by using a comsol finite element simulation software, inputting data of measured vibration signals of the test set, and, following a processing flow, inputting the data to the
   network that has been trained and preserved for the failure diagnosis.

\* \* \* \* \*